United States Patent
Kaspersky et al.

(10) Patent No.: US 10,258,851 B2
(45) Date of Patent: Apr. 16, 2019

(54) SYSTEM AND METHOD FOR CALCULATING PROJECTED IMPACT GENERATED BY SPORTS IMPLEMENTS AND GAMING EQUIPMENT

(71) Applicant: AO Kaspersky Lab, Moscow (RU)

(72) Inventors: Eugene V. Kaspersky, Moscow (RU); Daniil S. Borschev, Moscow (RU)

(73) Assignee: AO Kaspersky Lab, Moscow (RU)

( * ) Notice: Subject to any disclaimer, the term of this patent is extended or adjusted under 35 U.S.C. 154(b) by 0 days.

(21) Appl. No.: 15/263,596

(22) Filed: Sep. 13, 2016

(65) Prior Publication Data
US 2018/0071599 A1 Mar. 15, 2018

(51) Int. Cl.
*G06F 17/10* (2006.01)
*A63B 60/46* (2015.01)
(Continued)

(52) U.S. Cl.
CPC .......... *A63B 60/46* (2015.10); *A63B 71/0622* (2013.01); *A63D 15/00* (2013.01); *A63D 15/006* (2013.01); *G06F 17/5009* (2013.01); *A63B 2220/12* (2013.01); *A63B 2220/30* (2013.01); *A63B 2220/34* (2013.01); *A63B 2220/40* (2013.01); *A63B 2220/53* (2013.01); *A63B 2220/73* (2013.01); *A63B 2243/002* (2013.01)

(58) Field of Classification Search
None
See application file for complete search history.

(56) References Cited

U.S. PATENT DOCUMENTS 5,816,953 A 10/1998 Cleveland
6,640,200 B1 * 10/2003 Baum ................ A63B 24/0021
702/142
(Continued)

FOREIGN PATENT DOCUMENTS

WO 2013063684 A1 5/2013

OTHER PUBLICATIONS

Currin et al. Bayesian Prediction of Deterministic Functions With Applications to the Design and Analysis of Computer Experiments Journal of the American Statistical Association, vol. 86, No. 416, Dec. 1991, pp. 953-963.*

*Primary Examiner* — Rehana Perveen
*Assistant Examiner* — Cuong V Luu
(74) *Attorney, Agent, or Firm* — Arent Fox LLP; Michael Fainberg (57) ABSTRACT

Disclosed are systems and methods of calculating projected impact generated by sports and gaming implements. An exemplary method comprises: receiving a measurement from a sensor associated with a subject of impact; receiving a measurement from a sensor associated with an object of impact; wherein the at least one received measurement includes one or more characteristics of movement of the subject in response to an external stimuli and one or more characteristics of movement of the object in response to the impact by the subject; calculating, by a projection tool, a projected impact of the subject on the object before the actual impact; and calculating, by a modeling tool, a model of movement of the object in response to the impact by the subject based at least on the projected impact and one or more rules defining a movement of the object based on the projected impact by the subject.

20 Claims, 4 Drawing Sheets

(51) Int. Cl.
  *A63B 71/06*  (2006.01)
  *A63D 15/00*  (2006.01)
  *G06F 17/50*  (2006.01)

(56) References Cited

U.S. PATENT DOCUMENTS

| | | | |
|---|---|---|---|
| 8,292,709 | B2 | 10/2012 | Welch |
| 8,617,008 | B2 * | 12/2013 | Marty ................. G06T 7/70 273/317 |
| 9,026,396 | B2 | 5/2015 | Evans et al. |
| 9,026,398 | B2 * | 5/2015 | Takasugi ............. A63B 69/36 473/131 |
| 9,207,215 | B2 | 12/2015 | Ueda et al. |
| 2008/0021651 | A1 | 1/2008 | Seeley et al. |
| 2008/0312010 | A1 * | 12/2008 | Marty ............. A63B 24/0003 473/447 |
| 2013/0223686 | A1 * | 8/2013 | Shimizu ............. G08G 1/166 382/103 |
| 2014/0180451 | A1 * | 6/2014 | Marty ............. G09B 19/0038 700/91 |
| 2015/0317801 | A1 * | 11/2015 | Bentley ............. H04N 7/181 382/107 |
| 2015/0318015 | A1 * | 11/2015 | Bose ............. H04N 7/188 386/248 |
| 2015/0324636 | A1 * | 11/2015 | Bentley ............. G11B 27/17 386/227 |
| 2015/0348591 | A1 * | 12/2015 | Kaps ............. G11B 27/17 386/201 |
| 2016/0292881 | A1 * | 10/2016 | Bose ............. G06K 9/00342 |
| 2017/0021280 | A1 * | 1/2017 | Sugavanam ......... A63F 13/828 |
| 2017/0173791 | A1 * | 6/2017 | Dalibard ............. B25J 9/1674 |
| 2017/0229154 | A1 * | 8/2017 | Bose ............. G11B 27/031 |

* cited by examiner

SYSTEM AND METHOD FOR CALCULATING PROJECTED IMPACT GENERATED BY SPORTS IMPLEMENTS AND GAMING EQUIPMENT

FIELD OF TECHNOLOGY

The present disclosure relates generally to the field of data analysis and modeling, and more specifically, to systems and methods of calculating projected impact generated by sports implements and gaming equipment.

BACKGROUND

There exist a vast number of different games (such as children's games, computer games and sport games). There are both team games and individual games (player against player). Moreover, various games (such as sport games) can be played at a professional and amateur, regional and international level. A game is an activity which is meaningful in its process and in its outcome. The outcome is important to the participants and the spectators, and the game is played for its sake, the outcome of the game being the victory of one of the sides or a tie. The game process is the rules and techniques used by the players for victory.

Typically, different sports and games require different implements and equipment (such as balls, bats, pucks, rackets, etc.). These implements may be generally divided into two categories: objects of impact and subjects of impact. An object of impact may include an implement that can be moved around in the game process due to impact by some force. A game may have one object of impact (such as a soccer ball or a hockey puck) or many objects of impact (such as billiard balls). A subject of impact may include an implement used by a player to move the object (such as a hockey stick, a tennis racquet or a billiard cue).

Advances in computer, communications and sensor technologies made it possible to collect gaming data and to perform analysis of game techniques (e.g., calculate the striking force and project travel path of gaming objects). These technologies enable players to analyze their performance in order to improve their skills, and make gaming experience more exciting for spectators and fans by providing auxilary information about the game or sport.

However, the existing technologies do not provide solutions for projecting impact generated by sports implements and gaming equipment in real time and predicting outcome of a game based on modeling of the impact of various subject and objects of the game.

SUMMARY

Disclosed are various aspects of systems and methods of calculating projected impact generated by sports implements and gaming equipment. In one exemplary aspect, a method for projecting and modeling an impact on an object comprises: receiving a measurement from a sensor associated with a subject of impact; receiving a measurement from a sensor associated with an object of impact; wherein the at least one received measurement includes one or more characteristics of movement of the subject in response to an external stimuli and one or more characteristics of movement of the object in response to the impact by the subject; calculating, by a projection tool executable by a processor, a projected impact of the subject on the object before the actual impact based at least on the one or more characteristics of movement of the subject, wherein the impact is considered projected, when the calculated probability of impact between the subject and the object is above a threshold; and calculating, by a modeling tool executable by a processor, a model of movement of the object in response to the impact by the subject based at least on the projected impact and one or more rules defining a movement of the object based on the projected impact by the subject.

In one exemplary aspect, the subject and the object include a sports implement or a gaming equipment.

In one exemplary aspect, a characteristic of movement includes at least one of: a spatial coordinate, an altitude, a speed, an angular velocity, an acceleration, and a force of impact.

In one exemplary aspect, the projection tool further configured to use previously collected statistical data on impact of subjects and objects to calculate the projected impact.

In one exemplary aspect, the one or more rules include the rules of a game or a sport that characterize movement of the object in response to the impact by the subject.

In one exemplary aspect, the modeling tool further configured to generate a model of interaction of the object of the impact with one or more other objects.

In one exemplary aspect, the computer processor further configured to execute: an analysis tool configured to analyze the model of movement of the object and the model of the interaction of the object with other objects to forecast a gaming situation.

In one exemplary aspect, the computer processor further configured to execute: a display tool configured to display at least one of the projected impact, the model of movement of the object, and the forecast of the gaming situation in a graphic, image or video format.

In one exemplary aspect, the display tool is configured to display at least one of the projected impact, the model of movement of the object, and the forecast of the gaming situation in real time before, during or after the impact of the subject on the object.

In one exemplary aspect, the display tool is configured to display at least one of the projected impact, the model of movement of the object, and the forecast of the gaming situation using augmented reality or virtual reality format.

In one exemplary aspect, a method for projecting and modeling an impact on an object, comprises: receiving a measurement from a sensor associated with a subject of impact; receiving a measurement from a sensor associated with an object of impact; wherein the at least one received measurement includes one or more characteristics of movement of the subject in response to an external stimuli and one or more characteristics of movement of the object in response to the impact by the subject; calculating, by a projection tool executable by a processor, a projected impact of the subject on the object before the actual impact based at least on the one or more characteristics of movement of the subject, wherein the impact is considered projected, when the calculated probability of impact between the subject and the object is above a threshold; and calculating, by a modeling tool executable by a processor, a model of movement of the object in response to the impact by the subject based at least on the projected impact and one or more rules defining a movement of the object based on the projected impact by the subject.

The above simplified summary of example aspects serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and exemplary pointed out in the claims.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

DETAILED DESCRIPTION

Example aspects are described herein in the context of a system, method and computer program product for calculating projected impact generated by sports implements and gaming equipment. Those of ordinary skill in the art will realize that the following description is illustrative only and is not intended to be in any way limiting. Other aspects will readily suggest themselves to those skilled in the art having the benefit of this disclosure. Reference will now be made in detail to implementations of the example aspects as illustrated in the accompanying drawings. The same reference indicators will be used to the extent possible throughout the drawings and the following description to refer to the same or like items.

Figure 1A:
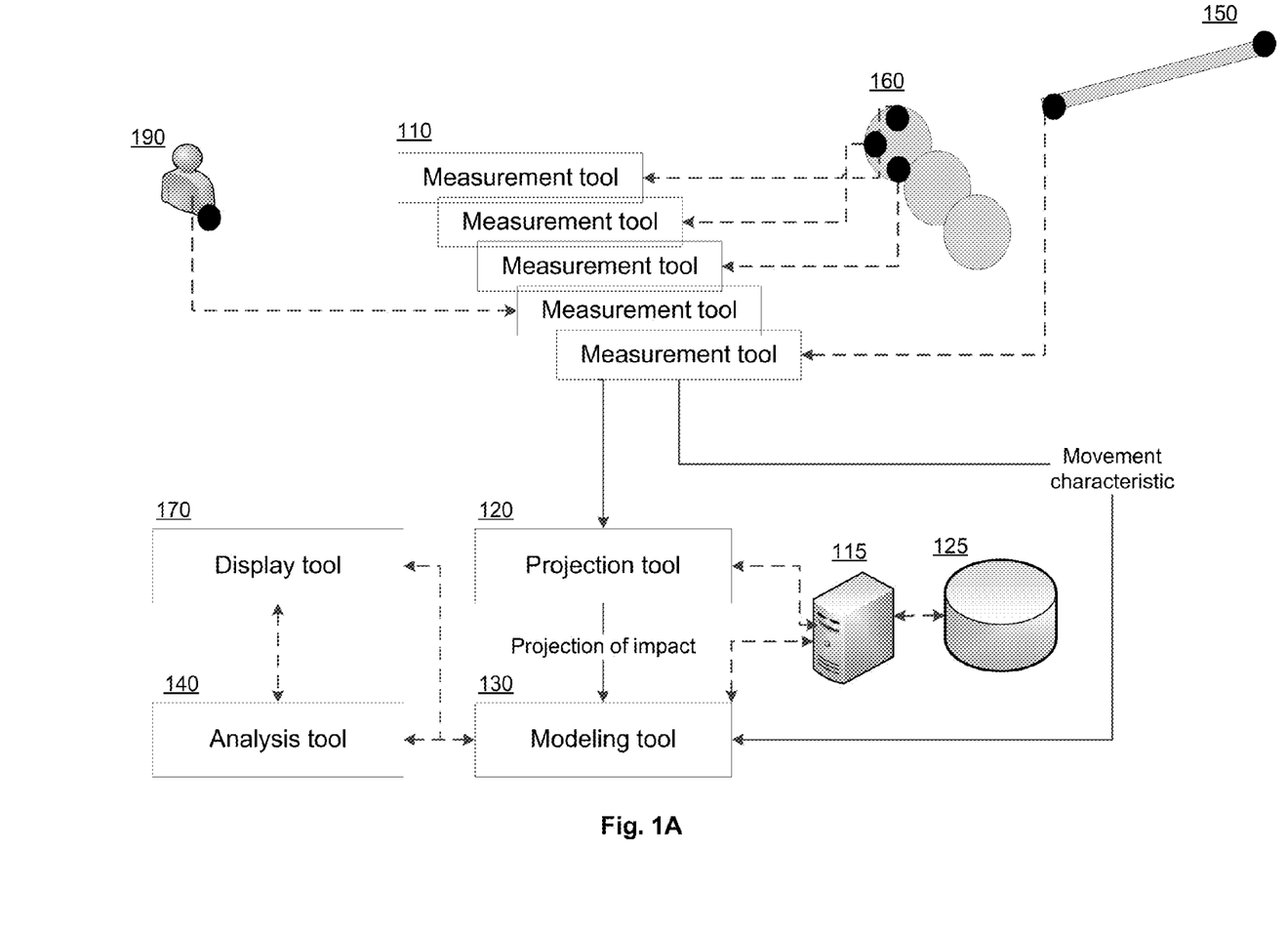
FIG. 1A depicts an exemplary aspect of a system for calculating projected impact generated by sports implements and gaming equipment.

FIG. 1 depicts an exemplary aspect of a system for calculating projected impact generated by sports implements and gaming equipment. In one exemplary aspect, the system includes a plurality of sports and gaming implements, such as at least one subject of impact 150 and at least one object of impact 160. The system may also include a plurality of measurement tools 110, a projection tool 120, a modeling tool 130, an analysis tool 140, a display tool 170, a computer system 115, and a database 125.

In one exemplary aspect, an object of impact 160 may include an implement that can be moved around in the game process due to impact by some force. A game may have one object of impact (such as a soccer ball or a hockey puck) or many objects of impact (such as billiard balls). In one exemplary aspect, a subject of impact 150 may include an implement used by a player 190 to move the object (such as a hockey stick, a tennis racquet or a billiard cue). It should be noted that immovable objects (such as soccer goal posts or a billiard table) are not considered to be either a subject or an object of impact for the purpose of this disclosure.

In one exemplary aspect, the measurement tool 110 may be mounted on, built in, attached to or otherwise connected to the sports and implements, such as the subject of impact 150 and/or the object of impact 160. In the general case, the measurement tool 110 should not disturb the weight balance, or change the outside dimensions of the subject 150 or object 160. The measurement tool 110 may be designed and/or configured to measure at least one characteristic of the movement of the sports or gaming implements 150 and 160. In one exemplary aspect, the measurement tool 110 may be a sensor (such as a piezoelectric sensor) mounted in the object of impact 150 (such as a billiard ball) or in the subject of impact 160 (such as a cue stick). In another exemplary aspect, additional measurement tools 110 may be arranged around the perimeter of the gaming field (such as a billiard table) to measure the characteristics of movement of the game implements based of signals received from the measurement tools 110 mounted in gaming implements 150 and 160. In one exemplary aspect, the measurement tools 110 may be also mounted into the surface of the gaming field.

In one exemplary aspect, the measurement tool 110 may be a sensor (such as piezoelectric sensor or the like) that measures movement of the gaming implements, including such characteristic of movement as: at least one coordinate of the subject or object in space; the altitude above sea level (barometric characteristic); the speed of movement; the angular velocity of movement; the acceleration during movement (g-sensor); any other characteristics of movement, including derivative quantities (such as momentum).

It should be noted that in one exemplary aspect the gaming implements 150 and/or 160 may have more than one measurement tool 110 associated therewith. It is possible to employ both measurement tools 110 of different characteristics of movement (such as a sensor of speed and a sensor of a coordinate in space) and measurement tool 110 of an identical characteristic of movement (such as three sensors for the coordinates in space).

In one exemplary aspect, one or more measurement tools 110 can be also placed on parts of the body of the player 190. In one exemplary aspect, they can be mounted into the equipment (such as helmet, gloves or shin guards). In another exemplary aspect, when no equipment is required for the game (such as tennis), the measurement tool 110 can be mounted into accessories of clothing of the player 190, such as wristbands or special cuffs.

All measured characteristics are transmitted by the measurement tool 110 to the projection tool 120 and to the modeling tool 130. In one exemplary aspect, they may be transmitted at a certain frequency (such as 1000 Hz). In another exemplary aspect, they are transmitted after a change detected by the measurement tool 110 in the characteristic relative to the preceding value (for example, when a ball on the billiard table is immobile, its measurement tool 110 does not transmit the measured characteristics of its movement, and the system considers the gaming implement 160 to be immobile).

In one exemplary aspect, the data transmitted by the measurement tool 110 to the projection tool 120 and the modeling tool 130 contain an identifier of the gaming implement 150, the gaming implement 160 and/or the player 190, on which they are placed.

In one exemplary aspect, the projection tool 120 may be implemented as a software program executable on a general-purpose computer system 115 or in a cloud service (not shown in FIG. 1). The projection tool 120 is configured to calculate the probability of an impact of the gaming subject 150 on the object 160 based on the characteristics of the movement of the game subject 150 and the gaming object 160 received from the measurement tools 110. This calculation in the general case may be done using knows mathematical methods for the interaction of objects in space based on their displacement in space (for example, the velocity, the angle, the position in three-dimensional space) and their dimensions.

Thus, the projection tool 120 calculates the probability of an impact of the subject 150 on the object 160 before occurrence of the impact. For example, whether in future (e.g., in one second) the cue stick will hit the cue ball in billiards, the racquet will hit the ball in tennis, or the stick will hit the puck in hockey. To calculate the probability of the impact, the data obtained from the measurement tool 110 (one, several, or all of them) is used.

In one exemplary aspect, the projection tool 120 may save the calculated probability of the impact between the subject 150 and object 160 and whether the actual impact occurred according to calculation. For example, from the characteristics of movement of the arm of the player 190, the racquet, and the tennis ball, as obtained from the measurement tool 110, the probability of an impact of the racquet on the tennis ball was calculated by the projection tool 120 to be equal to 0.7, but the striking of the ball by the racquet was not subsequently determined (for example, the ball did not change its direction of movement). As indicated above, data from the moving implements (the subject of impact 150 and the object of impact 160) is transmitted to the projection tool 120 by the measurement tool 110, and therefore the projection tool 120 determines the occurrence of impact using known mathematical methods based on changing characteristics of movement (an immobile subject 160 has begun to move, or the direction of movement of a moving object 160 has changed).

Thus, the projection tool 120 collects statistical data containing the calculated probability of an impact and the fact of the impact occurred (whether or not the impact occurred). In one exemplary aspect, the statistics are saved by the projection tool 120 in a database 125. It should be noted that, in one exemplary aspect, the projection tool 120 may save in the database 125 not only the probability of the impact, but also all data on the basis of which the probability was calculated, and also any other auxiliary data for the calculation. Moreover, the projection tool 120 may save in the database 125 data on the occurring event for collected statistics. The saved data can be used afterwards by the projection tool 120 for a more accurate calculation of the probability of the impact.

In one exemplary aspect, the projection tool 120 sends the calculated probability of the impact to the modeling tool 130. The modeling tool 130 may be implemented as a software program executable on a general-purpose computer system 115 or as a cloud service. The modeling tool 130 can be implemented both on the same computer device on which the projection tool 120 is implemented or on a separate device. In one exemplary aspect, the modeling tool 130 is configured to calculate the results of a probable impact of the gaming subject 150 on the gaming object 160 on the basis of the characteristics of movement, obtained from the measurement tool 110 and the probability of the impact as obtained from the projection tool 120. In one exemplary aspect, the calculation is made in the event that the calculated probability of the impact is greater than a threshold value at which the impact is considered to be likely. In one exemplary aspect, the result of the calculation is at least one characteristic of movement of at least one game object 160 after the probable impact by the gaming subject 150. For example, the direction of movement of a cue ball as a result of the cue stick striking it can be calculated up until the actual strike occurs.

In one exemplary aspect, the modeling tool 130 may calculate the movement of the gaming object 160 up to the moment when it stops. For example, after the hockey stick strikes the puck the speed and direction of movement of the puck is calculated, as well as the position of the puck after it stops. The modeling tool 130 can consider additional characteristics influencing the movement of the gaming object 160 (such as the coefficient of friction, the type of friction, the rotation, the resistance of the air, and other parameters).

In one exemplary aspect, if more than one gaming object is used in the game, the modeling tool 130 may calculate the interaction of the gaming objects 150 on each other. For example, after the cue stick strikes the cue ball in billiards, the cue ball starts to move (roll) and collides with other balls—objects of impact 160, which in turn can come into contact with each other (act on one another).

In one exemplary aspect, the modeling tool 130 may also calculate the change in the characteristics of movement of the subject of impact 150. This calculation in the general case may be done by using know mathematical methods for the interaction of objects in space on the basis of their displacement in space (for example, the velocity, the angle, the position in three-dimensional space) and their dimensions.

In one exemplary aspect, the modeling tool 130 saves the computed characteristics of movement of the gaming implements, including subject 150 and objects 160. As was indicated above, the data from the moving gaming implements is transmitted to the modeling tool 130 by the measurement tool 110, and therefore the modeling tool 130 determines the correspondence between the calculated characteristics of movement and the real characteristics of movement after the impact using known mathematical methods. Thus, the modeling tool 130 collects statistics on the calculation of the probable impact. In one exemplary aspect, the statistics may be saved in the database 125. It should be noted that the modeling tool 130, in one exemplary aspect, saves in the database 125 not only the calculated characteristics of movement, but also all data on the basis of which the characteristics were calculated, as well as any other auxiliary data for the calculation. Moreover, the modeling tool 130 may save in the database data on the actual movement of the gaming objects 160 after the impact of the gaming subject 150 for the gathering of the statistics. The saved data can afterwards be used by the modeling tool 130 to calculate the result of the impact.

In one exemplary aspect, the modeling tool 130 takes into account of the rules of the game when calculating the result of the impact of the subject 150 on the object(s) 160. The rules of the game can be saved in the database 125. The rules of the game may include conditions which are described by the characteristics of movement of the game objects 160. For example, no further calculation of the characteristics of movement of the puck by the modeling tool 130 is required when the condition is fulfilled "puck lands in the goal post" (goal scored in hockey), which can be determined from the coordinates of the puck. If the condition is fulfilled "ball lands in pocket" (for example, a change in height of the location of the ball by 10 cm downward in relation to the cue ball), no calculation of the characteristics of movement of the given ball is performed either by the modeling tool 130.

In one exemplary aspect, the modeling tool 130 may take into account additional rules that specify conditions related to the characteristics of movement of the gaming subject 150. For example, if the subject of impact 150 (the hockey stick) is at a certain distance away from the object of impact 160 (a puck), the modeling tool 130 does not perform the calculation of the characteristics of movement. In another example, if the subject 150 is directed upward (for example, the cue stick in billiards), no calculation of the characteristics of movement is performed either by the modeling tool 130.

The calculated characteristics are sent by the modeling tool 130 to an analysis tool 140. In one exemplary aspect, the analysis tool 140 performs analysis of the calculated characteristics of movement of the game objects 160 obtained from the modeling tool 130 on the basis of the rules of the game. The result of the analysis in the general case is a calculation of a prediction of a game situation. The game situation is a result of an impact of a gaming subject 150 on a gaming object 160 which is comprehensible to a human being (and not a characteristic of movement, which is calculated by the modeling tool 130).

In one exemplary aspect, the analysis tool 140 saves the prediction of the game situation in the database 125. The data from the database 125 can afterwards be used by the analysis tool 140 for a more accurate prediction of the game situation.

In one exemplary aspect, the prediction of the game situation can be used for the teaching of the players (a player already on the backswing before striking the object can see a prediction of the results of his strike). The mentioned results of the calculation of the result can be used, for example, during a joint integration of the present system with television systems. The viewer can be shown the projected results of an impact on a television screen (for example, by contrast dotted lines comprehensible to the viewer). Moreover, the prediction of the game situation prior to the striking of the object can be used for positioning to a television camera which is closest for example to the region of the gaming field where the predicted game situation is taking place, or to alternately change cameras depending on the calculation of balls landing in the pockets. Moreover, if a camera is mounted in the gaming object 160 (for example, on a movable gyroscopic support, not disturbing the weight and dimension characteristics of the gaming object 160), this can be controlled on the basis of the calculation of the prediction of the game situation. For example, to pan the camera depending on the direction of movement of the ball. The panning can occur in different directions, for example, if an action is predicted, the camera is panned in the direction of movement of the strike or towards the player, after the action the camera is panned according to the prediction of a collision with the edge of the table or other balls.

In another exemplary aspect, the results of the calculation of the prediction of the game situation as performed by the analysis tool 140 can be processed by display tool 170 for use in systems employing augmented reality or virtual reality. Thus, in one exemplary aspect, the display tool 170 may create a virtual image entirely on the basis of the results of the prediction. In another exemplary aspect, in systems using augmented reality, an image can be displayed showing its position relative to the gaming field and the results of the calculation of the prediction. For example, a person is located around a distant billiard table (or a virtual object which the system of augmented reality interprets as a billiard table), and depending on his position around the table an image is created in a virtual reality helmet or in goggles (such as Google Glass) by superimposing the results of the analysis on the real image (the one that the person sees). In one exemplary aspect, the results of the analysis of a game situation which will probably occur in future are displayed using these method by the display tool 170.

Figure 1B:
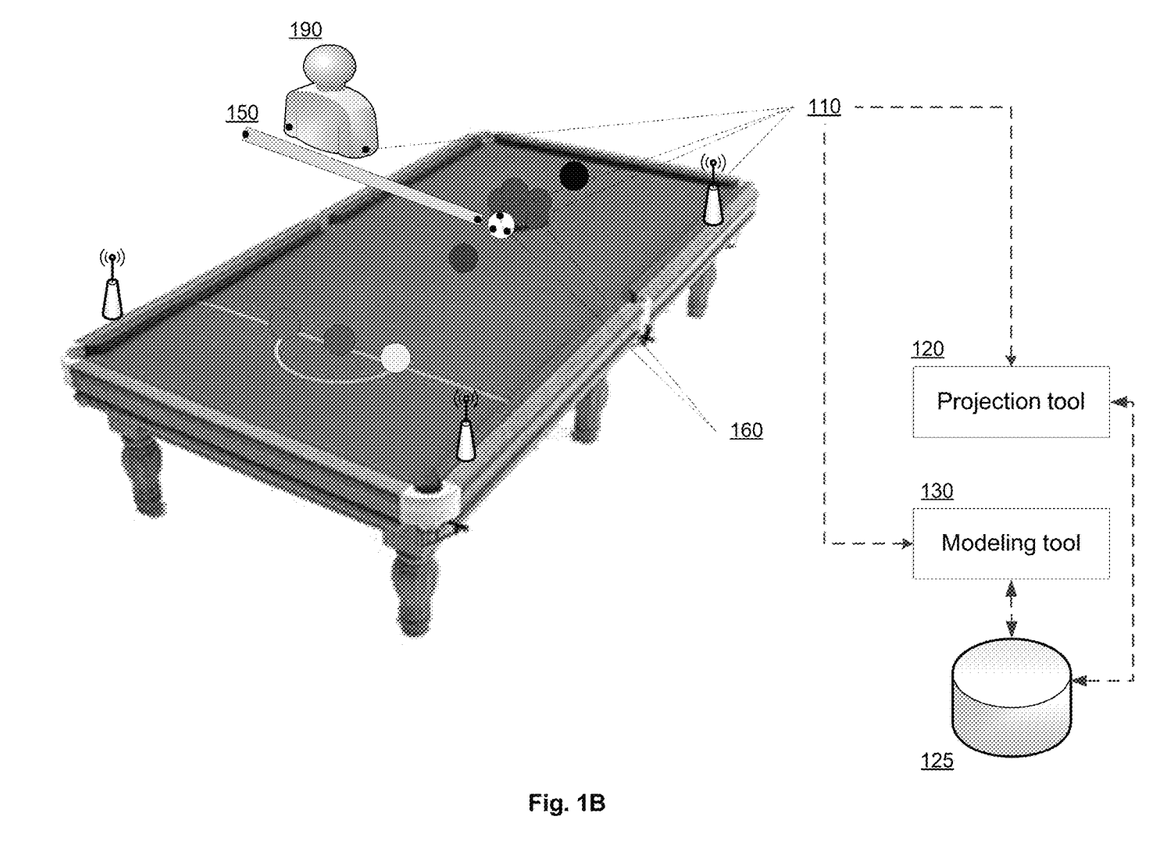
FIG. 1B depicts an example of operation of a system for calculating projected impact generated by sports implements and gaming equipment.

FIG. 1B depicts an example of operation of a system for calculating projected impact generated by sports implements and gaming equipment. In the given example, the player 190 is taking part in a game of snooker. Several balls (such as 5) are present on the billiard table, which need to be hit into pockets according to the rules of the game, along with a cue ball (the ball on which the cue stick acts). The player 190 holds the cue stick in his hands, and furthermore during the snooker game the player 190 is dressed in a special suit, with cuffs present on the sleeves of the suit. Thus, the billiard table is the gaming field. According to one aspect, measurement tools 110 may be positioned around the gaming field. Furthermore, there are 6 gaming objects 160 on the gaming field (5 balls and the cue ball), each of which according to one exemplary aspect is outfitted with three measurement tools 110. There is also a gaming subject 150—the cue stick, which is held by the player 190 in his hands. According to one exemplary aspect, the cue stick likewise contains two measurement tools 110, which are arranged at its ends. The cuffs of the suit of the player 190 in turn also contain at least one measurement tool 110 according to one exemplary aspect.

The characteristics of movements of the gaming implements 150 and 160 may be transmitted from the measurement tool 110, for example with the use of a wireless Wi-Fi network, to the projection tool 120. Given the multitude of measurement tool 110 (mobile and immobile, as well as their quantity), it is obvious that the system can rather accurately determine the characteristics of movement of the gaming subject 150 and objects 160.

In the general case, in the game of snooker, the player 190 at first takes aim. The cue stick is usually placed by the player 190 on his hand in front of the cue ball, one end of the cue stick being directed at the cue ball. Low-amplitude translational oscillations of the cue stick often occur during the aiming. From the coordinates of the hand of the player 190, obtained from the measurement tool 110 located in the cuff of the suit, and the calculated distance from the end of the cue stick to the cue ball, the projection tool 120 computes with high accuracy the point of the impact of the cue stick on the cue ball (for example, where on the sphere of the ball the striking by the cue stick will occur, at what angle, and with what speed). Moreover, in calculating the probability of the action, it is possible to make use of statistics on the shots of the given player 190, which the projection tool 120 selects from a database 125. For example, in a situation where, by the calculation of the projection tool 120, the player 190 will miss (is striking from afar and inaccurately), while the statistics from the database 125 contain information that 99.8% of the player's shots in a similar situation (on the basis of saved auxiliary data) hit their target exactly, the projection tool 120 calculates the probability of the action with statistics factored in at, for example, 90%. The projection tool 120 then sends the calculated probability of the impact between gaming implements to the modeling tool 130.

In the event that the probability of the impact between gaming implements is above a threshold value (probability is 90%, threshold value is 85%), the modeling tool 130 calculates the result of the action of the gaming subject 150 (the cue stick) on the gaming objects 160 (cue ball and other balls). For example, in a situation where the distance, calculated by the modeling tool 130, from the end of the cue stick to the cue ball is 5 cm, the energy transmitted at the moment of the action (the striking) is 10 Joules. However, statistically the given player 190 strikes much more strongly, and therefore in the course of the working of the system his shot from 5 cm will be calculated by the modeling tool 130 taking into account statistics obtained by the modeling tool 130 from the database 125, that is, the energy transmitted at the moment of striking, after a calculation taking into account the saved statistics, will be equal to 12 Joules, for example. Next, the characteristics of movement of the game objects 160 on the gaming field are calculated. Due to the impact generated by the the cue stick, the cue ball begins to roll, collides with other balls and makes them move too. Due to rolling friction, the speed of the game objects 160 slows down until all game objects 160 come to a complete stop.

In the event that the player 190 after taking aim decides to strike in another direction (for example, the direction of the strike did not seem advantageous to him), he moves to a different position on the periphery of the gaming field and again begins to take aim. At the time of the transition, the cue stick is pointed upward or in another direction, and the position of the tip of the cue stick has a substantial deviation with each step of the player 190. The projection tool 120 calculates the probability of impact of the cue stick on the cue ball at, for example, 5%. Or, according to one exemplary aspect, an additional rule is used, that an upwardly directed cue stick does not act on the cue ball. The probability of action in the given case is equal to zero. The modeling tool 130 does not calculate the results of such an impact, and the display tool 170 does not display the result of the calculation on a television screen.

Since the characteristics of movement of the gaming objects 160 arrive continually from the measurement tool 110, or as long as there is movement of at least one game object 160, the modeling tool 130 in the given example calculates the characteristics of the objects 160 (cue ball and balls) and corrects them up to the moment of stopping of all game objects 160.

Figure 2:
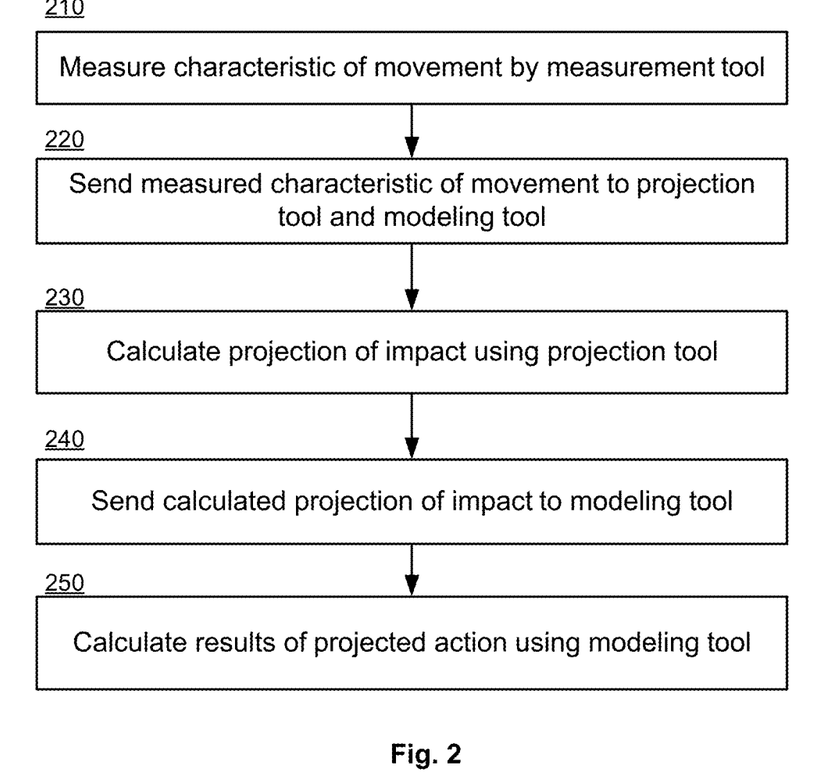
FIG. 2 depicts one exemplary aspect of a method for calculating projected impact generated by sports implements and gaming equipment.

FIG. 2 depicts one exemplary aspect of a method for calculating projected impact generated by sports implements and gaming equipment. In step 210, at least one characteristic of movement of the gaming subject 150 or the gaming object 160 is measured using one or more measurement tools 110. In step 220, the measured characteristics are sent to the projection tool 120 and the modeling tool 130. In step 230, the projection tool 120 calculates a projection of impact of the subject of impact 150 on the object(s) of impact 160 on the basis of the characteristics of movement of the subject 150 and object(s) 160. The impact may be considered to be predictable if the calculated probability of action is higher than a threshold value. In one exemplary aspect, the calculation of the projected impact of the gaming implements is saved by the projection tool 120 in a database 125. In step 240, the projection is sent to the modeling tool 130. In step 250, the results of the projected impact of the gaming implements is calculated using the modeling tool 130 based on of the aforementioned characteristics of movement of the gaming implements 150 and 160 received from the measurement tool 110, and/or also based on the projection received from the projection tool 120. The result of the calculation is at least one characteristic of movement of the gaming object 160 after the projected impact. In one exemplary aspect, the results of the projected impact of gaming implements are saved by the modeling tool 130 in database 125.

Figure 3:
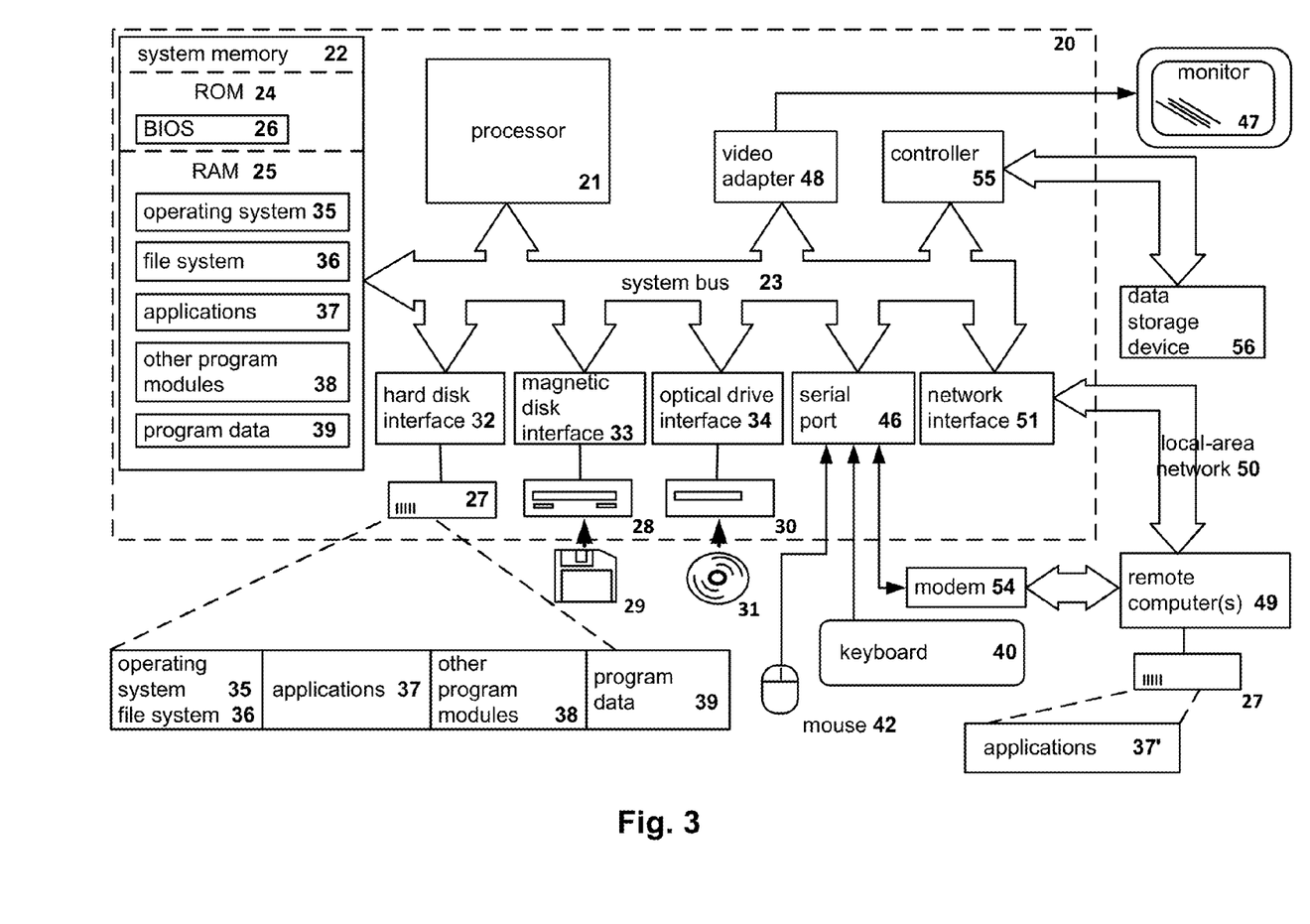
FIG. 3 depicts an example configuration of a general-purpose computer system on which aspects of the disclosed systems and method may be implemented.

FIG. 3 is a diagram illustrating a general-purpose computer system on which aspects of systems and methods for calculating projected impact generated by sports implements and gaming equipment may be implemented in accordance with an exemplary aspect.

As shown, the computer system 20 (which may be a personal computer or a server) includes a central processing unit 21, a system memory 22 and a system bus 23 connecting the various system components, including the memory associated with the central processing unit 21. As will be appreciated by those of ordinary skill in the art, the system bus 23 may comprise a bus memory or bus memory controller, a peripheral bus, and a local bus that is able to interact with any other bus architecture. The system memory may include permanent memory (ROM) 24 and random-access memory (RAM) 25. The basic input/output system (BIOS) 26 may store the basic procedures for transfer of information between elements of the computer system 20, such as those at the time of loading the operating system with the use of the ROM 24.

The computer system 20, may also comprise a hard disk 27 for reading and writing data, a magnetic disk drive 28 for reading and writing on removable magnetic disks 29, and an optical drive 30 for reading and writing removable optical disks 31, such as CD-ROM, DVD-ROM and other optical media. The hard disk 27, the magnetic disk drive 28, and the optical drive 30 are connected to the system bus 23 across the hard disk interface 32, the magnetic disk interface 33 and the optical drive interface 34, respectively. The drives and the corresponding computer information media are power-independent modules for storage of computer instructions, data structures, program modules and other data of the computer system 20.

An exemplary aspect comprises a system that uses a hard disk 27, a removable magnetic disk 29 and a removable optical disk 31 connected to the system bus 23 via the controller 55. It will be understood by those of ordinary skill in the art that any type of media 56 that is able to store data in a form readable by a computer (solid state drives, flash memory cards, digital disks, random-access memory (RAM) and so on) may also be utilized.

The computer system 20 has a file system 36, in which the operating system 35, may be stored, as well as additional program applications 37, other program modules 38, and program data 39. A user of the computer system 20 may enter commands and information using keyboard 40, mouse 42, or any other input device known to those of ordinary skill in the art, such as, but not limited to, a microphone, joystick, game controller, scanner, etc. Such input devices typically plug into the computer system 20 through a serial port 46, which in turn is connected to the system bus, but those of ordinary skill in the art will appreciate that input devices may be also be connected in other ways, such as, without limitation, via a parallel port, a game port, or a universal serial bus (USB). A monitor 47 or other type of display device may also be connected to the system bus 23 across an interface, such as a video adapter 48. In addition to the monitor 47, the personal computer may be equipped with other peripheral output devices (not shown), such as loudspeakers, a printer, etc.

Computer system 20 may operate in a network environment, using a network connection to one or more remote computers 49. The remote computer (or computers) 49 may be local computer workstations or servers comprising most or all of the aforementioned elements in describing the nature of a computer system 20. Other devices may also be present in the computer network, such as, but not limited to, routers, network stations, peer devices or other network nodes.

Network connections can form a local-area computer network (LAN) 50 and a wide-area computer network (WAN). Such networks are used in corporate computer networks and internal company networks, and they generally have access to the Internet. In LAN or WAN networks, the personal computer 20 is connected to the local-area network 50 across a network adapter or network interface 51. When networks are used, the computer system 20 may employ a modem 54 or other modules well known to those of ordinary skill in the art that enable communications with a wide-area computer network such as the Internet. The modem 54, which may be an internal or external device, may be connected to the system bus 23 by a serial port 46. It will be appreciated by those of ordinary skill in the art that said network connections are non-limiting examples of numerous well-understood ways of establishing a connection by one computer to another using communication modules.

In various aspects, the systems and methods described herein may be implemented in hardware, software, firmware, or any combination thereof. If implemented in software, the methods may be stored as one or more instructions or code on a non-transitory computer-readable medium. Computer-readable medium includes data storage. By way of example, and not limitation, such computer-readable medium can comprise RAM, ROM, EEPROM, CD-ROM, Flash memory or other types of electric, magnetic, or optical storage medium, or any other medium that can be used to carry or store desired program code in the form of instructions or data structures and that can be accessed by a processor of a general purpose computer.

In various aspects, the systems and methods described in the present disclosure can be addressed in terms of tools. The term "tool" as used herein refers to a real-world device, component, or arrangement of components implemented using hardware, such as by an application specific integrated circuit (ASIC) or field-programmable gate array (FPGA), for example, or as a combination of hardware and software, such as by a microprocessor system and a set of instructions to implement the tool's functionality, which (while being executed) transform the microprocessor system into a special-purpose device. A tool may also be implemented as a combination of the two, with certain functions facilitated by hardware alone, and other functions facilitated by a combination of hardware and software. In certain implementations, at least a portion, and in some cases, all, of a tool may be executed on the processor of a general purpose computer (such as the one described in greater detail in FIG. 3, supra). Accordingly, each tool may be realized in a variety of suitable configurations, and should not be limited to any particular implementation exemplified herein.

In the interest of clarity, not all of the routine features of the aspects are disclosed herein. It would be appreciated that in the development of any actual implementation of the present disclosure, numerous implementation-specific decisions must be made in order to achieve the developer's specific goals, and these specific goals will vary for different implementations and different developers. It is understood that such a development effort might be complex and time-consuming, but would nevertheless be a routine undertaking of engineering for those of ordinary skill in the art, having the benefit of this disclosure.

Furthermore, it is to be understood that the phraseology or terminology used herein is for the purpose of description and not of restriction, such that the terminology or phraseology of the present specification is to be interpreted by the skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

The various aspects disclosed herein encompass present and future known equivalents to the known systems and tools referred to herein by way of illustration. Moreover, while aspects and applications have been shown and described, it would be apparent to those skilled in the art having the benefit of this disclosure that many more modifications than mentioned above are possible without departing from the inventive concepts disclosed herein.

The invention claimed is:

1. A system for projecting and modeling an impact on an object, the system comprising:
    at least one subject of impact, wherein the subject is associated with a sensor configured to measure one or more characteristics of movement of the subject in response to an external stimuli;
    an electronic memory configured to store:
        at least one first measurement received from the sensor associated with the subject that includes one or more characteristics of movement of the subject in response to the external stimuli,
        at least one second measurement received from a sensor associated with an object of impact, and
        statistical data on impacts of the subject on the object in previous situations; and
    a computer processor coupled to the memory and configured to:
        calculate a probability of a projected impact of the subject on the object in a current situation before the actual impact based at least on the one or more characteristics of movement of the subject and the collected statistical information;
        generate a model of movement of the object in response to the impact by the subject based at least on the projected impact determined by the projection tool and one or more rules defining a movement of the object based on the projected impact by the subject;
        calculate results of the projected impact on the basis of the at least one first measurement, the model of movement, and the calculated probability of the projected impact, when the calculated probability is above a threshold indicating that an impact is likely;
        determine a correspondence between the model of movement of the object and the actual movement of the object after the impact to improve modeling;
        stop generation of the model of movement when a rule of the one or more rules is fulfilled; and
        create one or more images related to the results and augment a visual display with the one or more images.

2. The system of claim 1, wherein the subject and the object include a sports implement or a gaming equipment.

3. The system of claim 1, wherein the at least one first measurement and the at least one second measurement each include at least one of: a spatial coordinate, an altitude, a speed, an angular velocity, an acceleration, and a force of impact of the subject and object, respectively.

4. The system of claim 1, wherein the electronic memory stores collected statistical data of a player using the subject in the previous situations, and wherein the processor is further configured to use the collected statistical data of the player in the previous situations to calculate the probability of the projected impact in the current situation.

5. The system of claim 1, wherein the one or more rules include the rules of a game or a sport that characterize movement of the object in response to the impact by the subject, and wherein the one or more rules include the rules of a game or sport that specify conditions that characterize movement of the subject.

6. The system of claim 1, wherein the processor further is configured to generate a model of interaction of the object of the impact with one or more other objects.

7. The system of claim 6, wherein the computer processor is further configured to:
analyze the model of movement of the object and the model of the interaction of the object with other objects to forecast a gaming situation comprehensible by a human, and
utilize the gaming situation for modifying behavior of one or more cameras capturing the subject and the object.

8. The system of claim 7, wherein the computer processor further configured to execute:
a display tool configured to display at least one of the projected impact, the model of movement of the object, and the forecast of the gaming situation in a graphic, image or video format.

9. The system of claim 8, wherein the display tool is configured to display at least one of the projected impact, the model of movement of the object, and the forecast of the gaming situation in real time before, during or after the impact of the subject on the object.

10. The system of claim 8, wherein the display tool is configured to display at least one of the projected impact, the model of movement of the object, and the forecast of the gaming situation using augmented reality or virtual reality format.

11. A method for projecting and modeling an impact on an object, the method comprising:
providing a sensor, wherein the sensor is configured to measure one or more characteristics of movement of an associated subject of movement in response to an external stimuli;
receiving a first measurement from the sensor associated with the subject that includes one or more characteristics of movement of the subject in response to the external stimuli;
receiving a second measurement from a sensor associated with an object of impact;
storing statistical data on impacts of the subject on the object in previous situations;
calculating, by a projection tool executable by a processor, a probability of a projected impact of the subject on the object in a current situation before the actual impact based at least on the one or more characteristics of movement of the subject and the collected statistical information;
generating, by a modeling tool executable by a processor, a model of movement of the object in response to the impact by the subject based at least on the projected impact determined by the projection tool and one or more rules defining a movement of the object based on the projected impact by the subject;
calculating results of the projected impact on the basis of the at least one first measurement, the model of movement, and the calculated probability of the projected impact, when the calculated probability is above a threshold indicating that an impact is likely;
determining a correspondence between the model of movement of the object and the actual movement of the object after the impact to improve modeling;
stopping generation of the model of movement when a rule of the one or more rules is fulfilled; and
creating one or more images related to the results and augmenting a visual display with the one or more images.

12. The method of claim 11, wherein the subject and the object include a sports implement or a gaming equipment.

13. The method of claim 11, wherein the at least one first measurement and the at least one second measurement each include at least one of: a spatial coordinate, an altitude, a speed, an angular velocity, an acceleration, and a force of impact of the subject and object, respectively.

14. The method of claim 11, further comprising:
storing collected statistical data of a player using the subject in the previous situations; and
using, by the projection tool, the collected statistical data of the player in the previous situations to calculate the probability of the projected impact in the current situation.

15. The method of claim 11, wherein the one or more rules include the rules of a game or a sport that characterize movement of the object in response to the impact by the subject, and wherein the one or more rules include the rules of a game or sport that specify conditions that characterize movement of the subject.

16. The method of claim 11, further comprising generating, by the modeling tool, a model of interaction of the object of the impact with one or more other objects.

17. The method of claim 16, further comprising:
analyzing, by an analysis tool executable by a processor, the model of movement of the object and the model of the interaction of the object with other objects to forecast a gaming situation comprehensible by a human, and utilizing the gaming situation for modifying behavior of one or more cameras capturing the subject and the object.

18. The method of claim 17, further comprising:
displaying, by a display tool executable by a processor, at least one of the projected impact, the model of movement of the object, and the forecast of the gaming situation in a graphic, image or video format.

19. The method of claim 18, further comprising:
displaying, by the display tool, at least one of the projected impact, the model of movement of the object, and the forecast of the gaming situation in real time.

20. The method of claim 18, further comprising:
displaying, by the display tool, at least one of the projected impact, the model of movement of the object, and the forecast of the gaming situation using augmented reality or virtual reality format.

* * * * *